(12) United States Patent
Shimura

(10) Patent No.: US 9,767,895 B1
(45) Date of Patent: Sep. 19, 2017

(54) SEMICONDUCTOR MEMORY DEVICE AND CONTROLLING METHOD THEREOF

(71) Applicant: TOSHIBA MEMORY CORPORATION, Minato-ku (JP)

(72) Inventor: Yasuhiro Shimura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/267,545

(22) Filed: Sep. 16, 2016

Related U.S. Application Data

(60) Provisional application No. 62/308,586, filed on Mar. 15, 2016.

(51) Int. Cl.
| | |
|---|---|
| *G11C 16/10* | (2006.01) |
| *G11C 11/56* | (2006.01) |
| *G11C 16/34* | (2006.01) |
| *G11C 16/08* | (2006.01) |
| *H01L 29/792* | (2006.01) |
| *H01L 27/1157* | (2017.01) |
| *H01L 27/11582* | (2017.01) |
| *H01L 27/11573* | (2017.01) |

(52) U.S. Cl.
CPC ...... *G11C 11/5628* (2013.01); *G11C 11/5642* (2013.01); *G11C 16/08* (2013.01); *G11C 16/10* (2013.01); *G11C 16/3459* (2013.01); *H01L 27/1157* (2013.01); *H01L 27/11573* (2013.01); *H01L 27/11582* (2013.01); *H01L 29/7923* (2013.01)

(58) Field of Classification Search
CPC .............................. G11C 16/10; G11C 16/26
USPC ........................................ 365/185.03, 185.24
See application file for complete search history.

(56) References Cited

U.S. PATENT DOCUMENTS

| | | | | |
|---|---|---|---|---|
| 6,396,738 | B1* | 5/2002 | Tamada | G11C 16/3454 |
| | | | | 365/185.19 |
| 7,656,710 | B1* | 2/2010 | Wong | G11C 11/5628 |
| | | | | 365/185.18 |
| 7,915,663 | B2 | 3/2011 | Hayakawa | |
| 8,897,075 | B2* | 11/2014 | Choi | G11C 16/10 |
| | | | | 365/185.18 |

(Continued)

FOREIGN PATENT DOCUMENTS

| | | |
|---|---|---|
| JP | 2014-175022 | 9/2014 |
| WO | WO 2007/013405 A1 | 2/2007 |

*Primary Examiner* — Michael Tran
(74) *Attorney, Agent, or Firm* — Oblon, McClelland, Maier & Neustadt, L.L.P.

(57) ABSTRACT

The control unit performs a first writing operation to obtain a first threshold voltage distribution, and a second writing operation to obtain a second threshold voltage distribution lower than the first threshold voltage distribution, and a third threshold voltage distribution higher than the first threshold voltage distribution. A verify reading operation is performed to determine whether any of the first to third threshold voltage distributions has been obtained. A step-up writing operation, in accordance with a result of the verify reading operation, increases a program voltage by a predetermined step-up width. The step-up writing operation, after start of the second writing operation, sets the step-up width to a first step-up width, and when the second writing operation has reached a predetermined phase, changes a second step-up width greater than the first step-up width at least once.

20 Claims, 8 Drawing Sheets

(56) References Cited

U.S. PATENT DOCUMENTS

| | | | |
|---|---|---|---|
| 9,240,238 B2 | 1/2016 | Raghu et al. | |
| 9,361,998 B2 | 6/2016 | Maejima | |
| 9,390,800 B2 * | 7/2016 | Shiino | G11C 16/0483 |
| 9,437,302 B2 * | 9/2016 | Tseng | G11C 11/5628 |
| 9,501,400 B2 * | 11/2016 | Muroi | G06F 12/0246 |
| 9,552,882 B2 * | 1/2017 | Tseng | G11C 11/5628 |

* cited by examiner

[Lower Page Program]

[Upper Page Program]

[Program]

[Lower Page Program]

[Upper Page Program]

[Upper Page Program]

[Lower Page Program]

[Middle Page Program]

[Upper Page Program]

SEMICONDUCTOR MEMORY DEVICE AND CONTROLLING METHOD THEREOF

This application is based on and claims the benefit of priority from prior US prior provisional Patent Application No. 62/308,586, filed on Mar. 15, 2016, the entire contents of which are incorporated herein by reference.

BACKGROUND

Field

Embodiments described herein relate generally to a semiconductor memory device and a controlling method thereof.

Description of the Related Art

As one of semiconductor memory devices, there has been provided a flash memory. In particular, since its inexpensiveness and large capacitance, a NAND flash memory has been generally widely used. Up to the present, many techniques to further increase the capacitance of this NAND flash memory have been proposed. One of the techniques is a structure of three-dimensionally disposed memory cells. In such three-dimensional semiconductor memory device, the memory cells are disposed in a laminating direction. Conductive layers extend from the respective memory cells, which are disposed in the laminating direction. The memory cells each include memory films, which include electric charge accumulating layers, between a semiconductor layer, which will become a channel, and word lines. Such three-dimensional semiconductor memory device has been requested to speed up a writing operation and reduce power consumption.

DETAILED DESCRIPTION

Figure 1:
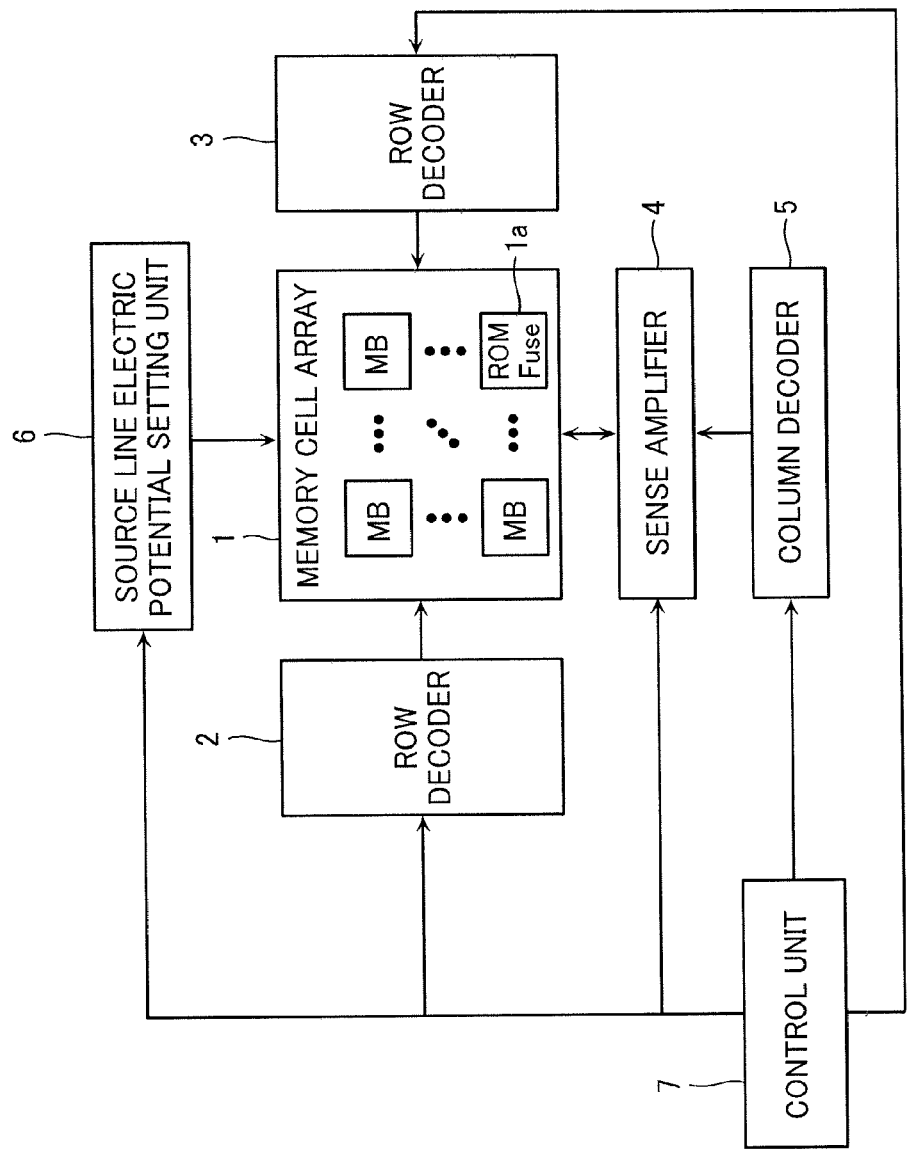
FIG. 1 is a block diagram describing a configuration of a semiconductor memory device according to a first embodiment.

A semiconductor memory device according to embodiments includes a memory cell array and a control unit. The memory cell array includes memory cells arranged therein, and the memory cells include an electric charge accumulating layer, respectively. The control unit controls the memory cells. The control unit is configured to perform a first writing operation, a second writing operation, and a verify reading operation. The first writing operation is performed to write first data to one of the memory cells corresponding to first page data and thereby to obtain a first threshold voltage distribution, while performing a step-up writing operation to increase a program voltage applied to a control gate of a memory cell by a predetermined step-up width. The second writing operation is performed to write second data to the one of the memory cells corresponding to second page data and thereby to obtain a second threshold voltage distribution lower than the first threshold voltage distribution, and a third threshold voltage distribution higher than the first threshold voltage distribution, while performing the step-up writing operation. The verify reading operation determines whether any of the first to third threshold voltage distributions has been obtained. The step-up writing operation being performed based on a result of the verify reading operation. The step-up writing operation sets the step-up width to a first step-up width after start of the second writing operation and, changes a second step-up width greater than the first step-up width at least once when the second writing operation has reached a predetermined phase.

The semiconductor memory device according to the embodiments will be described hereinafter with reference to the accompanying drawings. Here, these embodiments are only examples. For example, the semiconductor memory device described below has a structure where a memory string extends in a direction intersecting with a substrate as a longitudinal direction. The similar operation is also applicable to the structure having a U shape where a memory string is folded to the opposite side in the middle. The respective drawings of the semiconductor memory devices used in the following embodiments are schematically illustrated. The thickness, the width, the ratio, and a similar parameter of the layer are not necessarily identical to actual parameters.

The following embodiments relate to a nonvolatile semiconductor memory device in a structure where a plurality of metal-oxide-nitride-oxide-semiconductor (MONOS) type memory cells (transistors) are disposed in a height direction. The MONOS type memory cell includes: a semiconductor film disposed in a columnar shape perpendicular to the substrate as a channel, and a gate electrode film disposed on the side surface of the semiconductor film via an electric charge accumulating layer. However, these embodiments are applicable to a semiconductor memory device having another type, for example, a semiconductor-oxide-nitride-oxide-semiconductor type (SONOS) memory cell, a metal-aluminum oxide-nitride-oxide-semiconductor type (MA-NOS) memory cell, and a memory cell that uses hafnium oxide ($HfO_x$) or tantalum oxide ($TaO_x$) other than silicon nitride as an electric charge accumulating layer having a large number of trap sites for capturing electric charge in an insulating film.

First Embodiment

First, the following describes an overall configuration of a semiconductor memory device according to a first embodiment.

FIG. 1 is a block diagram describing a configuration of the semiconductor memory device according to the first embodiment. This semiconductor memory device includes a memory cell array 1, row decoders 2 and 3, a sense amplifier 4, a column decoder 5, a source line electric potential setting unit 6, and a control unit 7.

The memory cell array 1 includes a plurality of memory blocks MB. The memory blocks MB each include a plurality of memory transistors. The memory transistors are a plurality of charge-accumulation-type memory cells that are three-dimensionally disposed. As described later, the semiconductor memory device of the embodiment is configured to be able to hold plural bits (multivalued data), for example, 2-bit data in one memory cell. Then, this 2-bit data is written to the memory cell by two operations, a lower page writing operation to write lower page data, and an upper page writing operation to write upper page data. Although the illustration is omitted, the writing operation is performed in units of pages that are a plurality of memory cells connected in common to one word line.

The memory block MB is the smallest unit of a data erasure operation. Some of the memory blocks MB among the plurality of memory blocks MB may be configured as a ROM fuse block 1a for storing initial setting data, trimming data, redundancy data for relief against failure, and similar data. The data in the ROM fuse block 1a is read after power-on of this apparatus. The read data is forwarded to and stored in the control unit 7 or a similar device.

The row decoders 2 and 3 decode retrieved block address signals or similar signals during a writing operation and a reading operation of data in the memory cell array 1 to drive a predetermined word line or a similar line. The sense amplifier 4 detects electric signals flowing through a bit line during the reading operation and amplifies the electric signals. The column decoder 5 decodes column address signals to control the sense amplifier 4. The source line electric potential setting unit 6 controls an electric potential of a source line SL. The control unit 7 steps up a voltage to generate a high voltage used for the writing operation and the erasure operation. Besides, the control unit 7 generates control signals to control the row decoders 2 and 3, the sense amplifier 4, the column decoder 5, and the source line electric potential setting unit 6. The control unit 7 also controls the memory cell array 1 via these components.

Figure 2:
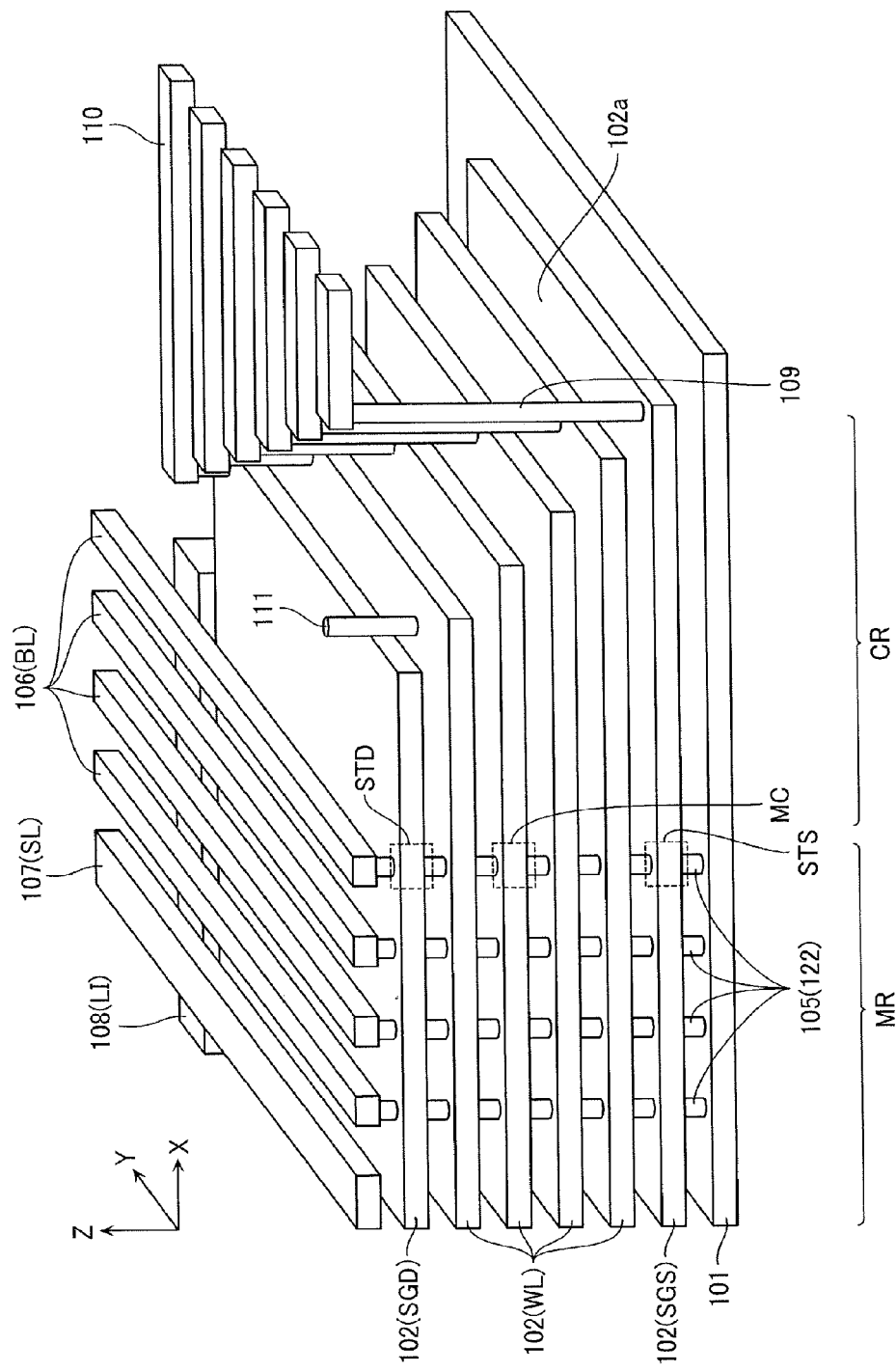
FIG. 2 is a schematic perspective view illustrating a configuration of a part of a memory cell array of the semiconductor memory device according to the first embodiment.

Next, the following describes the schematic configuration of the memory cell array 1 according to the embodiment with reference to FIG. 2. FIG. 2 is a schematic perspective view illustrating the configuration of a part of the memory cell array 1. FIG. 2 omits illustrations of a part of configurations such as interlayer insulating layers for simplifying the description. For simplifying the illustration, the numbers of respective wirings also differ from those of other drawings.

The memory cell array 1 according to the first embodiment includes a substrate 101 and a plurality of conductive layers 102. The conductive layers 102 are laminated on the substrate 101 in a Z direction. Between the conductive layers 102, an interlayer insulating layer (not illustrated) is disposed.

The memory cell array 1 includes a plurality of memory shafts 105 extending in the Z direction. The memory shaft 105 has a lower end connected to the substrate 101, and an upper end electrically connected to a bit line BL. The intersection portions of the conductive layers 102 and the memory shafts 105 function as a source-side selection transistor STS, the memory cell MC, or a drain-side selection transistor STD. The conductive layer 102 is a conductive layer made of, for example, tungsten (W) or polysilicon. The conductive layer 102 functions as a word line WL, a source side selection gate line SGS, and a drain side selection gate line SGD.

The plurality of conductive layers 102 include wiring portions, which are formed into a stepped pattern, on the end portions in the X direction. In the description below, an area at which the memory cell MC or a similar component is disposed is referred to as a memory area MR. A part where the conductive layers 102 are formed into the stepped pattern by extracting the conductive layers 102 from this memory area MR is referred to as a stepped wiring area CR.

The conductive layers 102 in the stepped wiring area CR have parts at top surface ends not covered with the conductive layers 102 positioned at their upper layers. The parts form contact portions 102a. These contact portions 102a of the conductive layers 102 are connected to lower ends of contact plugs 109. Upper ends of the contact plugs 109 are connected to wirings 110. The contact plug 109 and the wiring 110 are formed of conductive layers made of tungsten or a similar material.

The memory cell array 1 according to the first embodiment may include a plurality of support pillars 111 to support between the layers during manufacture. The support pillars 111, similarly to the memory shafts 105, are formed such that these lower ends are connected to the substrate 101. The support pillars 111 may have structures similar to the memory shafts 105, or may be constituted of only insulators such as silicon oxide. FIG. 2 representatively illustrates the only one support pillar 111. However, the actual device can include the more support pillars 111 (see FIG. 5A and FIG. 5B).

The memory cell array 1 according to the first embodiment includes a conductive layer 108. The conductive layer 108 is opposed to the side surfaces of the plurality of conductive layers 102 in the Y direction and extends in the X direction. The lower surface of the conductive layer 108 is in contact with the substrate 101. The conductive layer 108 is a conductive layer made of, for example, tungsten (W). The conductive layer 108 functions as a source contact LI, which connects the source line SL and the substrate 101.

The memory cell array 1 according to the first embodiment includes a plurality of conductive layers 106 and a conductive layer 107. The plurality of conductive layers 106 and the conductive layer 107 are disposed above the plurality of conductive layers 102 and memory shafts 105. The plurality of conductive layers 106 are disposed in the X direction. The plurality of conductive layers 106 and the conductive layer 107 extend in the Y direction. The memory shafts 105 are each connected to the lower surfaces of the conductive layers 106. The conductive layer 106 is, for example, constituted of a conductive layer such as tungsten (W) and functions as the bit line BL. The conductive layer 108 is connected to the lower surface of the conductive layer 107. The conductive layer 107 is, for example, constituted of the conductive layer such as tungsten (W) and functions as the source line SL.

Figure 3:
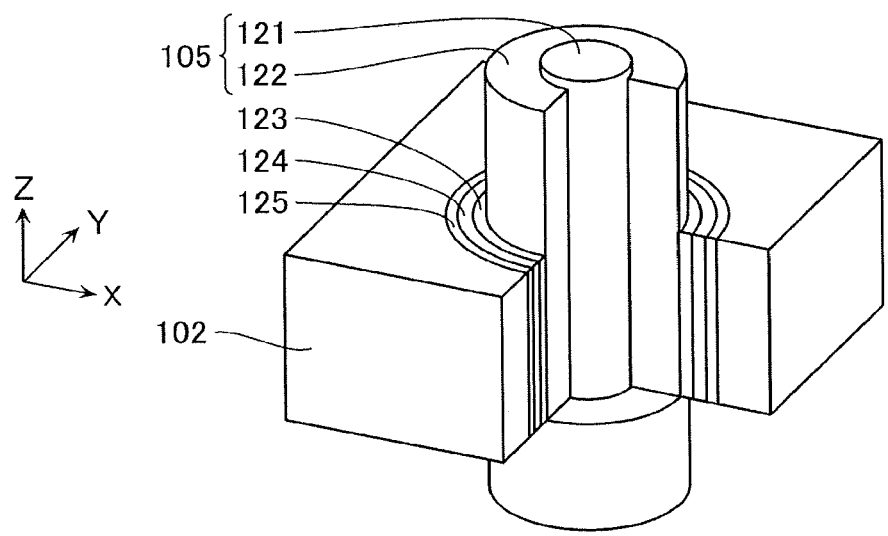
FIG. 3 is a schematic diagram illustrating a schematic configuration of a memory cell MC of the semiconductor memory device according to the first embodiment.

Next, with reference to FIG. 3, the following describes the schematic configuration of the memory cell MC according to the first embodiment. FIG. 3 is a schematic perspective view illustrating the configuration of the memory cell MC. Although FIG. 3 illustrates the configuration of the memory cell MC, the source-side selection transistor STS and the drain-side selection transistor STD may also be configured similar to the memory cell MC. FIG. 3 omits a part of the configuration.

The memory cell MC is disposed at a portion where the conductive layer 102 intersects with the memory shaft 105. The memory shaft 105 includes a core insulating layer 121 and a columnar semiconductor layer 122. The semiconductor layer 122 covers the sidewall of the core insulating layer 121. Moreover, between the semiconductor layer 122 and the conductive layer 102, a memory gate insulating film is disposed. The memory gate insulating film includes a tunnel insulating layer 123, an electric charge accumulating layer 124, and a block insulating layer 125. The core insulating layer 121 is constituted of, for example, an insulating layer such as silicon oxide (SiO$_2$). The semiconductor layer 122 is constituted of, for example, a semiconductor layer such as polysilicon and functions as a channel for the memory cell MC. The tunnel insulating layer 123 is constituted of, for example, an insulating layer such as silicon oxide (SiO$_2$). The electric charge accumulating layer 124 is constituted of, for example, an insulating film such as silicon nitride (SiN) that can accumulate electric charges to a trap site. The block insulating layer 125 is constituted of, for example, an insulating layer such as silicon oxide (SiO$_2$). An amount of electric charges accumulated to this electric charge accumulating layer 124 changes the threshold voltage of the memory cell MC. The memory cell MC stores data corresponding to the value of this threshold voltage. Then, for storing 2-bit data, the memory cell MC of this embodiment is configured to be able to hold four types of threshold voltage distributions. This point will be described later.

In the writing operation to the memory cell MC, a predetermined write voltage is applied to the word line WL (the conductive layer 102), while 0 V is applied to the semiconductor layer 122, for example. This accumulates electrons in the electric charge accumulating layer 124, increasing the threshold voltage of the memory cell MC. Inversely, in the erasure operation to the memory cell MC, 0 V is applied to the word line WL, for example, while a predetermined erasure voltage (for example, 20 V or more) is applied to the semiconductor layer 122 (the channel). This injects holes to the electric charge accumulating layer 124 or inversely discharges the electrons from the electric charge accumulating layer 124, thus reducing the threshold voltage of the memory cell MC.

The material of the semiconductor layer 122, similarly to the above-described polysilicon, is possibly constituted of a semiconductor such as SiGe, SiC, Ge, and C. On contact surfaces between the semiconductor layer 122 and the substrate 101 or the conductive layers 106, silicide may be formed.

Figure 4:
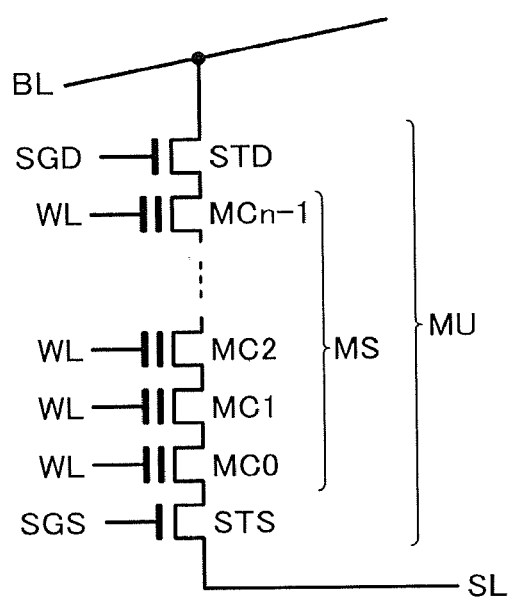
FIG. 4 is an equivalent circuit diagram of a memory unit MU of the semiconductor memory device according to the first embodiment.

The memory cell MC and the selection transistors STD and STS with the above-described structure are connected in series, thus configuring the memory unit MU as illustrated in FIG. 4. That is, the memory unit MU includes a memory string MS, the source-side selection transistor STS, and the drain selection transistor STD. The memory string MS includes the plurality (n pieces) of memory cells MC (MC0 to MCn-1) connected in series. The source-side selection transistor STS and the drain selection transistor STD are connected to respective ends of the memory string MS. Although the illustration is omitted, a plurality of memory units MU connected to a common word line WL constitute the above-described memory block MB. Some of the plurality of memory cells MC in the memory string MS can be dummy cells not used for data storage. The number of dummy cells may be set to any given number.

Next, the following describes writing operations of the semiconductor memory device according to the first embodiment with reference to FIG. 5A, FIG. 5B, FIG. 6, FIG. 7, and FIG. 8A.

The semiconductor memory device of this first embodiment is configured to be able to employ a method of storing 2-bit data in one memory cell MC (2 bits/cell). The 2-bit data can be written in two phases of the lower page writing operation and the upper page writing operation.

Figure 5A:
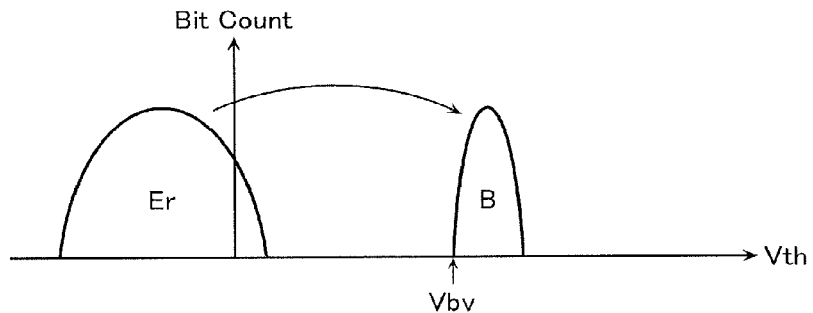
FIG. 5A, FIG. 5B, FIG. 6, FIG. 7, FIG. 8A, and FIG. 8B illustrate operations of the semiconductor memory device of the first embodiment.

The lower page writing operation is a writing operation to write lower-bit data among the 2-bit data. Specifically, as illustrated in FIG. 5A, when writing the lower page data "0" to the memory cell in a threshold voltage distribution Er (data "11") indicating an erased state, the writing operation is performed to provide a threshold voltage distribution B representing this lower page data "0." When the lower page data is "1," the threshold voltage distribution Er is maintained to provide a write inhibit state.

Figure 5B:
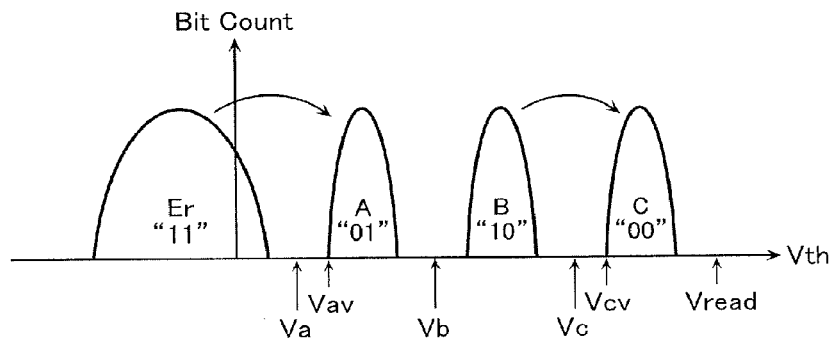

On the other hand, the upper page writing operation is a writing operation to write upper-bit data among the 2-bit data. Specifically, as illustrated in FIG. 5B, when writing the upper page data "0" to the memory cell having the threshold voltage distribution Er (data "11") or the threshold voltage distribution B, the writing operation is performed to provide a threshold voltage distribution A or C. To provide the threshold voltage distribution A to the memory cell MC having the threshold voltage distribution Er, and to provide the threshold voltage distribution C to the memory cell MC having the threshold voltage distribution B, a voltage applying operation is performed. When the upper page data is "1," the threshold voltage distribution Er or B is maintained to provide the write inhibit state.

Figure 6:
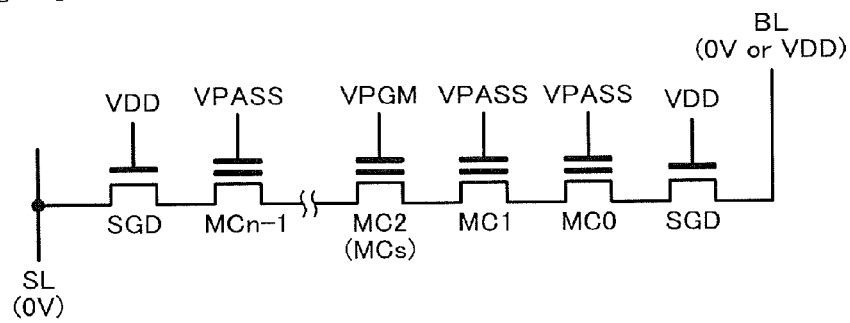

Both the lower page writing operation and the upper page writing operation are performed by applying the voltage as illustrated in FIG. 6 to the respective wirings. To the selected word line WL connected to the selected memory cell MCs (MC2 in the illustrated example), a program voltage VPGM (for example, 20 V or more) to perform writing is applied. On the other hand, to the word line WL where a non-selected memory cell is connected, a writing path voltage VPASS to the extent that conducts the memory cell MC (for example, around 8 to 10 V) and not for writing is applied, thus not performing the writing. To the bit line BL, corresponding to data to be written, a power supply voltage VDD or 0 V is applied. To the selection gate lines SGD and SGS connected to the selection transistors STD and STS respectively, the power supply voltage VDD is applied. The source line SL has voltage with, for example, 0 V.

After the voltage as illustrated in FIG. 6 performs the lower page writing operation or the upper page writing operation, the verify reading operation is performed as a reading operation to confirm whether desired threshold voltage distributions A, B, and C have been obtained. The verify reading operation, similarly to the ordinary reading operation, applies verify reading voltages Vav, Vbv, and Vcv corresponding to lower limit values of the respective threshold voltage distributions to the selected word line WL connected to the selected memory cell MC (see FIG. 5A and FIG. 5B). These verify reading voltages Vav, Vbv, and Vcv, corresponding to the lower limit values of threshold voltage distributions A, B, and C, are voltages greater than reading voltages Va, Vb, and Vc provided to the control gate of the selected memory cell in the reading operation, respectively.

On the other hand, to a non-selected word line connected to the non-selected memory cell, regardless of held data, a reading path voltage Vread that can conduct the memory cell MC (for example, a value greater than an upper limit value of the threshold voltage distribution C) is provided. To the bit line BL, a predetermined precharge voltage Vb is provided. In this state, when the current flows through the selected memory cell MC, it is determined that the writing operation to the threshold voltage distribution corresponding to the verify reading voltage has not been completed (FAIL). On the other hand, when the current does not flow through the selected memory cell MC, it is determined that the writing operation has been completed (PASS).

When the writing operation has been determined to be FAIL in this verify reading operation, the program voltage VPGM is set to a value greater by the predetermined step-up width in the next writing operation. This operation is referred to as the step-up writing operation below.

As described above, in the writing operation of the embodiment, even in the lower page writing operation, the writing operation is performed to provide the threshold voltage distribution B with a narrow distribution width corresponding to the lower page data. In contrast, a typically known planar type (two-dimensional type) semiconductor memory device, considering influence of proximity interference between memory cells, takes a method for writing an intermediate distribution that is wider than a final threshold voltage distribution in the lower page writing operation. The three-dimensional type semiconductor memory device such as the embodiment has a large-size memory cell compared with the one of the planar type, and an electric charge accumulating layer formed to cover a peripheral area of a memory shaft. This makes the influence of the proximity interference small compared with the one of the planar type semiconductor memory device. As described above, even in the lower page data writing operation, this enables to perform the writing operation that provides the threshold voltage distribution B with a narrow width corresponding to the data. However, when writing the narrow threshold voltage distribution even in the lower page data writing operation in this way, the step-up width in the step-up writing operation has to be made smaller. This causes the time for the writing operation to become longer and increases power consumption.

Figure 7:
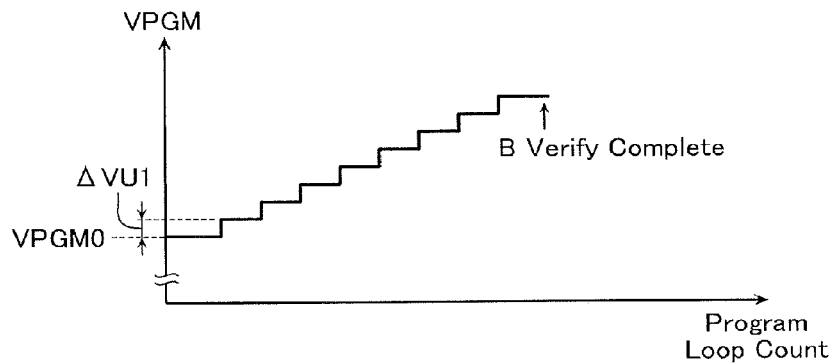

In view of this point, the step-up writing operation of the embodiment performs the lower page writing operation as in FIG. 7.

In FIG. 7, the horizontal axis indicates the number of repeat of the writing operation and the verify reading operation, and the vertical axis indicates voltage values of the program voltage VPGM. After performing the writing operation at the voltage illustrated in FIG. 6 by setting the program voltage VPGM to an initial value VPGM0, the above-described verify reading operation is performed. When a result of the verify reading operation is FAIL, the step-up writing operation is performed, and then the program voltage VPGM increases only by a step-up value $\Delta$VU1. In the next lower page writing operation, the writing operation is performed by setting the program voltage VPGM to VPGM0+$\Delta$VU1. As a result of repeat of such writing operation and verify reading operation, if it is confirmed that the verify reading operation has obtained PASS, that is, if it is confirmed that the threshold voltage distribution B has been obtained, the lower page writing operation terminates.

Figure 8A:
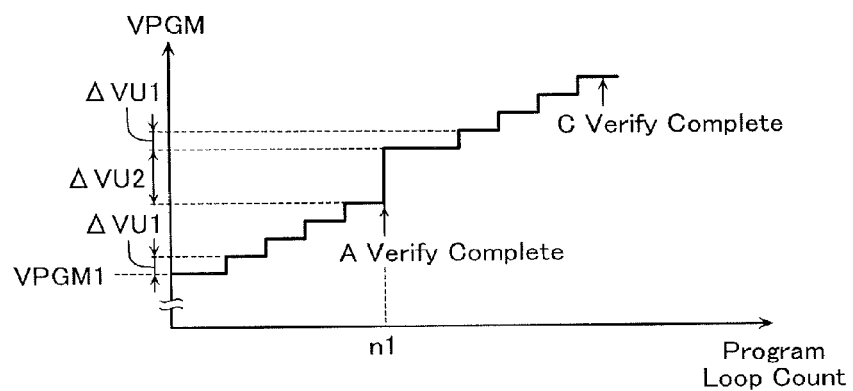

FIG. 8A illustrates the step-up writing operation in the upper page writing operation. The step-up writing operation at this time is basically similar to the step-up writing operation in the lower page writing operation (in FIG. 7), however the step-up writing operations have different methods.

This upper page writing operation, as illustrated in FIG. 5B, is a writing operation to obtain the threshold voltage distribution A or C. In view of this, in the upper page writing operation of this first embodiment, as illustrated in FIG. 8A, for example, when the verify reading operation determines that all selected memory cells MCs in one memory finger have reached the threshold voltage distribution A at n1-th loop, the next step-up writing operation employs a step-up width $\Delta$VU2 greater than the above-described step-up width $\Delta$VU1. That is, the embodiment determines that when the selected memory cell MC is determined to reach the threshold voltage corresponding to the threshold voltage distribution A, the upper page writing operation has reached a predetermined phase.

The value of this step-up width $\Delta$VU2 is not limited to a specific value, but it is at least greater than of the value of $\Delta$VU1. The step-up writing operation with the step-up width $\Delta$VU2 is performed only once in FIG. 8A, however this should not be construed in a limiting sense. The step-up writing operation with the step-up width $\Delta$VU2 may be performed twice or more.

Figure 8B:
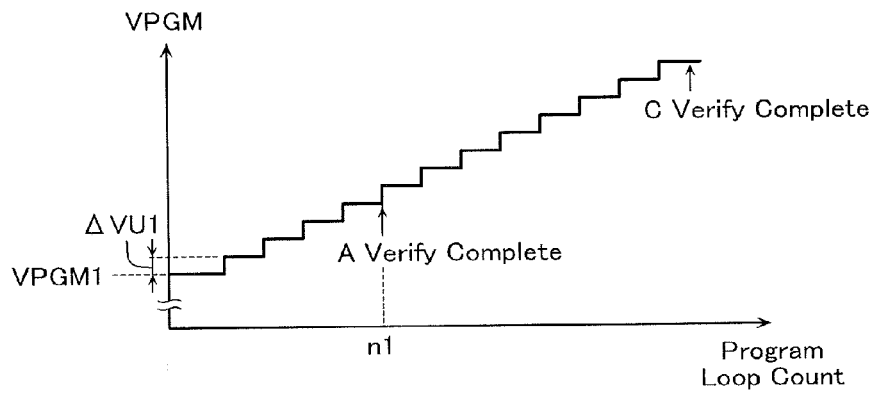

Performing the step-up writing operation with such large step-up width $\Delta$VU2 ensures the entirely reduced time needed for the writing operation. In a comparative example illustrated in FIG. 8B, such large step-up width $\Delta$VU2 is not employed, and the step-up width is fixed at $\Delta$VU1. In a case of an operation of such comparative example, even after obtaining the threshold voltage distribution A at the selected memory cell MC, the step-up writing operation with the small step-up width $\Delta$VU1 is repeated. Such step-up writing operation in the upper page writing operation after the threshold voltage distribution B is obtained is a waste of time, and causes increase of power consumption.

On the other hand, in the upper page writing operation of the first embodiment (in FIG. 5B), when the threshold voltage distribution A has been obtained in the selected memory cell MC, the upper page writing operation after that continues as a writing operation to provide the threshold voltage distribution C. The verify reading operation at this time is set to the voltage Vcv corresponding to the lower limit value of the threshold voltage distribution C, for example. In other words, after obtaining the threshold voltage distribution A in the upper page writing operation, the operation for writing the threshold voltage distribution B is not performed, and only the operation for writing the threshold voltage distribution C which is greater than this threshold voltage distribution B is performed. In view of this, after start of the upper page writing operation, when it is determined that the writing operation to the threshold voltage distribution A has been completed, the embodiment changes the step-up width in the step-up writing operation from the ordinary step-up value $\Delta$VU1 to the step-up value $\Delta$VU2, which is greater than it. This makes threshold voltage distribution change of the memory cell slightly rough, however since the memory cells to provide the threshold voltage distribution B do not exist, providing such large step-up width $\Delta$VU2 does not cause any problem. Instead, providing such step-up width ensures the reduced time needed for the writing operation.

After providing the step-up width $\Delta$VU2 at least once, it is preferable that the step-up width is returned to $\Delta$VU1, because it restricts increase in distribution width of the threshold voltage distribution C. However, the step-up width may be a value smaller than $\Delta$VU2, and it is also possible to set the step-up width to a value different from a value of $\Delta$VU1.

Second Embodiment

Figure 9:
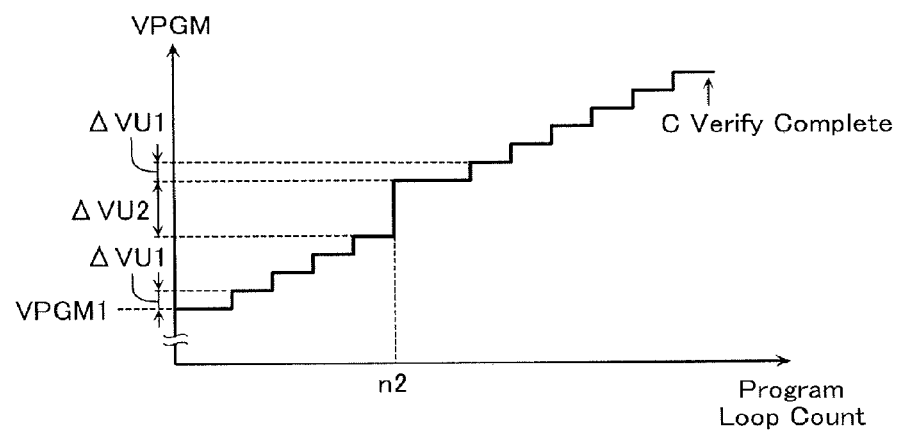
FIG. 9 illustrates operations of a semiconductor memory device of a second embodiment.

Next, the following describes a semiconductor memory device according to a second embodiment with reference to FIG. 9. In this second embodiment, the overall structure of the semiconductor memory device is approximately similar to that of the first embodiment (in FIG. 1 to FIG. 4). Therefore, the overlapped description will not be further elaborated below.

This second embodiment differs from the first embodiment in detail of the writing operation. This second embodiment, similarly to the first embodiment, is to perform the writing operation of 2 bits/cell, as illustrated in FIG. 5A and FIG. 5B. The step-up writing operation in the lower page writing operation is also similar to the one of the first embodiment. However, in this second embodiment, a condition switching the step-up width from ΔVU1 to ΔVU2 is different from the first embodiment.

That is, this embodiment counts the number of the upper page writing operation and the verify reading operation by, for example, a counter (not illustrated), and when the count has reached a predetermined value n2 or more, switches the step-up width from ΔVU1 to ΔVU2. That is, the embodiment, when the number of the writing and the verify reading has reached a predetermined number, determines that the upper page writing operation has reached the predetermined phase regardless of whether or not the verify reading operation has detected that writing to the threshold voltage distribution A has been completed. However, the above-described predetermined number is determined, according to the number of loop of the writing operation and the verify reading operation that is obtained at a certain halfway stage after the step-up of the program voltage VPGM is started from the initial value ΔVPGM1, and before the writing operation shifts to writing of the threshold voltage distribution C. The above-described predetermined value n2 can be stored, for example, in the above-described ROM fuse block 1a.

This second embodiment can also provide an advantage approximately similar to the first embodiment.

Third Embodiment

Next, the following describes a semiconductor memory device according to a third embodiment with reference to FIG. 10A to FIG. 10C, and FIG. 11. In this third embodiment, the overall structure of the semiconductor memory device is approximately similar to that of the first embodiment (in FIG. 1 to FIG. 6). Therefore, the overlapped description will not be further elaborated below.

This third embodiment differs from the above-described embodiments in detail of the writing operation. This third embodiment is to write 3-bit data to one memory cell (3 bits/cell), and in this point, is different from the above-described embodiments, which are to perform the writing operation of 2 bits/cell.

Figure 10A:
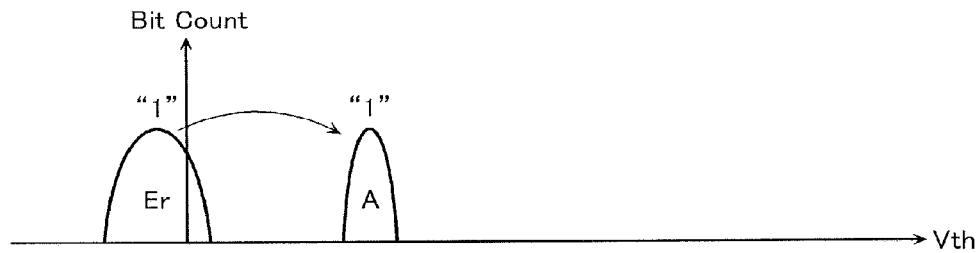
FIG. 10A to FIG. 10C, and FIG. 11 illustrate operations of a semiconductor memory device of a third embodiment.
Figure 10B:
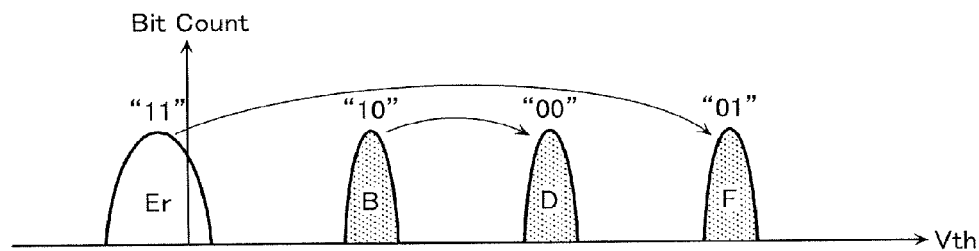
Figure 10C:
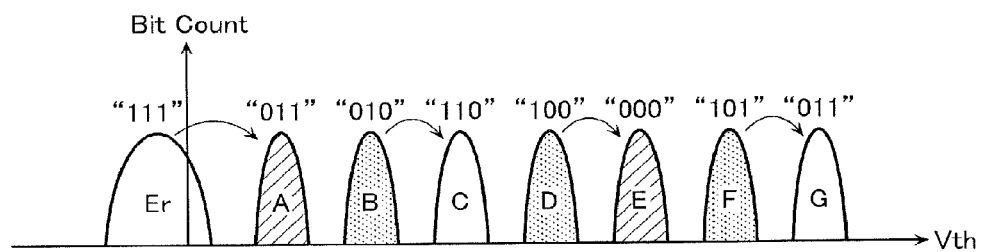

This writing operation of 3 bits/cell is performed, for example, as in FIG. 10A to FIG. 10C. This writing operation, as one example, is divided into three: a lower page writing operation (in FIG. 10A), a medium page writing operation (FIG. 10B), and an upper page writing operation (in FIG. 10C). This can obtain the threshold voltage distribution Er indicating the erased state, and threshold voltage distributions A to G.

As illustrated in FIG. 10A, when the lower page data is "0," the lower page writing operation performs the writing operation to provide the threshold voltage distribution B from the threshold voltage distribution Er, and when the lower page data is "1," the lower page writing operation maintains the threshold voltage distribution Er.

As illustrated in FIG. 10B, when the medium page data is "0," the medium page writing operation performs the writing operation to provide the threshold voltage distributions D and F, and when the medium page data is "1", the medium page writing operation maintains the threshold voltage distribution Er or B.

As illustrated in FIG. 10C, the upper page writing operation also, in accordance with the upper page data, in a predetermined case, performs the writing operation to provide the threshold voltage distributions A, C, E, and G, and in a case except for this, maintains the original threshold voltage distributions Er, B, D, and F.

A procedure illustrated in FIG. 10A to FIG. 10C is merely one example. The procedure differs according to a method of allocating data in the writing operations of respective pages.

Figure 11:
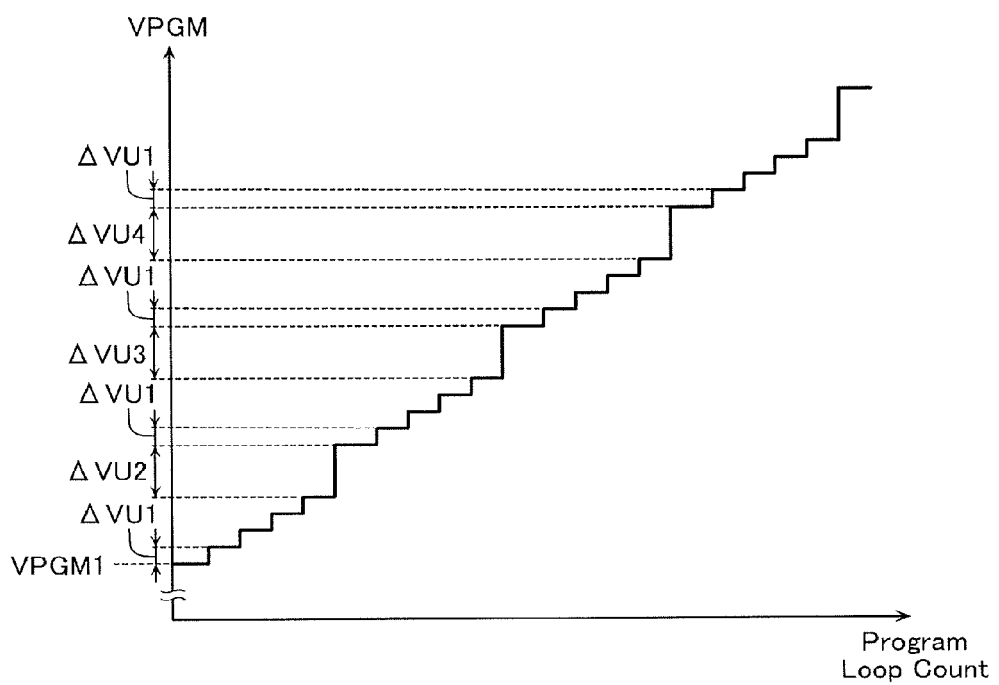

The medium page data writing and the upper page data writing of this third embodiment, similarly to the above-described embodiments, can switch the step-up width during the step-up writing operation when certain condition is obtained. FIG. 11 illustrates an exemplary step-up writing operation during the upper page writing operation. When the writing operation of 3 bits/cell as in FIG. 10A to FIG. 10C is performed, the upper page writing operation further provides the threshold voltage distributions A, C, E, and G, in addition to the threshold voltage distributions Er, B, D, and F obtained in the medium page writing operation. In this case, the upper page writing operation firstly changes the threshold voltage distribution Er of the memory cell into the threshold voltage distribution A by repeating the voltage applying operation and the verify reading operation. Then, when the threshold voltage distribution A is obtained, similarly to the above-described embodiment, the upper page writing operation switches the step-up width from ΔVU1 to ΔVU2, and thereafter returns the step-up width, for example, to ΔVU1. Similarly, when the threshold voltage distributions C or E is obtained, the upper page writing operation increases the step-up width at least once. In this way, the embodiment performing the writing operation of 3 bits/cell can also provide an advantage similar to the above-described embodiments.

Although the illustration is omitted, even when providing data of 4 bits or more to one memory cell MC, similar step-up writing operation can be employed.

[Others]

While a certain embodiment has been described, this embodiment has been presented by way of example only, and is not intended to limit the scope of the inventions. Indeed, the novel method and system described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
 a memory cell array that includes memory cells arranged therein, the memory cells including an electric charge accumulating layer, respectively; and
 a control unit that controls the memory cells, wherein the control unit is configured to perform,
  a first writing operation to write first data to one of the memory cells corresponding to first page data and thereby to obtain a first threshold voltage distribution, while performing a first step-up writing operation to increase a program voltage applied to a control gate of a memory cell by a predetermined step-up width,
  a second writing operation to write second data to the one of the memory cells corresponding to second page data and thereby to obtain a second threshold voltage distribution lower than the first threshold voltage distribution, and a third threshold voltage distribution higher than the first threshold voltage distribution, while performing a second step-up writing operation to increase a program voltage applied to a control gate of a memory cell by a predetermined step-up width, the second threshold voltage distribution and the third threshold voltage distribution corresponding to the second page data, and a verify reading operation to determine whether any of the first to third threshold voltage distributions has been obtained, the step-up writing operation being performed based on a result of the verify reading operation, wherein the second step-up writing operation sets the step-up width to a first step-up width after start of the second writing operation and changes a second step-up width greater than the first step-up width at least once when the second writing operation is judged as having reached a predetermined phase based on the result of the verify reading operation.

2. The semiconductor memory device according to claim 1, wherein
the second step-up writing operation sets the step-up width to a third step-up width smaller than the second step-up width after the second step-up writing operation with the second step-up width.

3. The semiconductor memory device according to claim 1, wherein
the second step-up writing operation switches the step-up width to the second step-up width when having determined that the second threshold voltage distribution has been obtained during the verify reading operation after the start of the second writing operation.

4. The semiconductor memory device according to claim 3, wherein
the second step-up writing operation sets the step-up width to a third step-up width smaller than the second step-up width after the second step-up writing operation with the second step-up width.

5. The semiconductor memory device according to claim 1, wherein
the second step-up writing operation switches the step-up width to the second step-up width after the step-up writing operation is repeated predetermined times or more after the start of the second writing operation.

6. The semiconductor memory device according to claim 5, wherein
the second step-up writing operation sets the step-up width to a third step-up width smaller than the second step-up width after the second step-up writing operation with the second step-up width.

7. The semiconductor memory device according to claim 1, wherein
the verify reading operation detects completion of a writing operation to the third threshold voltage after the second step-up writing operation with the second step-up width is performed.

8. The semiconductor memory device according to claim 7, wherein
the second step-up writing operation switches the step-up width to the second step-up width when having determined that the second threshold voltage distribution has been obtained during the verify reading operation after the start of the second writing operation.

9. The semiconductor memory device according to claim 1, wherein
the memory cell array includes:
a plurality of conductive layers laminated on a semiconductor substrate,
a semiconductor layer that has a peripheral area surrounded by the conductive layer and extends in a first direction perpendicular to the semiconductor substrate as a longitudinal direction, and
a memory gate insulating film that is disposed between the semiconductor layer and the conductive layer and includes an electric charge accumulating layer.

10. The semiconductor memory device according to claim 9, wherein
the memory gate insulating film, in addition to the electric charge accumulating layer, includes:
a tunnel insulating layer positioned closer to the semiconductor layer than the electric charge accumulating layer; and
a block insulating layer positioned closed to the conductive layer than the electric charge accumulating layer.

11. The semiconductor memory device according to claim 1, wherein
the memory cells are each configured to store multivalued data.

12. The semiconductor memory device according to claim 11, wherein
the first writing operation is an operation to write lower-bit data of the multivalued data, and
the second writing operation is an operation to write upper-bit data upper than the lower-bit data.

13. A controlling method of a semiconductor memory device including a memory cell array, the memory cell array including memory cells arranged therein, the memory cells including an electric charge accumulating layer, respectively, the controlling method comprising performing a first writing operation to write first data to one of the memory cells corresponding to first page data and thereby to obtain a first threshold voltage distribution, while performing a first step-up writing operation to increase a program voltage applied to a control gate of a memory cell by a predetermined step-up width, performing a second writing operation to write second data to the one of the memory cells corresponding to second page data and thereby to obtain a second threshold voltage distribution lower than the first threshold voltage distribution, and a third threshold voltage distribution higher than the first threshold voltage distribution, while performing a second step-up writing operation to increase a program voltage applied to a control gate of a memory cell by a predetermined step-up width, the second threshold voltage distribution and the third threshold voltage distribution corresponding to the second page data, and performing a verify reading operation to determine whether any of the first to third threshold voltage distributions has been obtained after the first or second writing operation, the step-up writing operation being performed based on a result of the verify reading operation, wherein the second step-up writing operation sets the step-up width to a first step-up width after start of the second writing operation, and changes a second step-up width greater than the first step-up width at least once when the second writing operation is judged as having reached a predetermined phase based on the result of the verify reading operation.

14. The controlling method according to claim 13, wherein
the second step-up writing operation sets the step-up width to a third step-up width smaller than the second step-up width after the second step-up writing operation with the second step-up width.

15. The controlling method according to claim 13, wherein
the second step-up writing operation switches the step-up width to the second step-up width when having determined that the second threshold voltage distribution has been obtained during the verify reading operation after the start of the second writing operation.

16. The controlling method according to claim 15, wherein
the second step-up writing operation sets the step-up width to a third step-up width smaller than the second step-up width after the second step-up writing operation with the second step-up width.

17. The controlling method according to claim 13, wherein
the second step-up writing operation switches the step-up width to the second step-up width after the step-up writing operation is repeated predetermined times or more after the start of the second writing operation.

18. The controlling method according to claim 17, wherein
the second step-up writing operation sets the step-up width to a third step-up width smaller than the second step-up width after the second step-up writing operation with the second step-up width.

19. The controlling method according to claim 13, wherein
the verify reading operation detects completion of a writing operation to the third threshold voltage after the second step-up writing operation with the second step-up width is performed.

20. The controlling method according to claim 19, wherein
the second step-up writing operation switches the step-up width to the second step-up width when having determined that the second threshold voltage distribution has been obtained during the verify reading operation after the start of the second writing operation.

* * * * *